Figure 1:
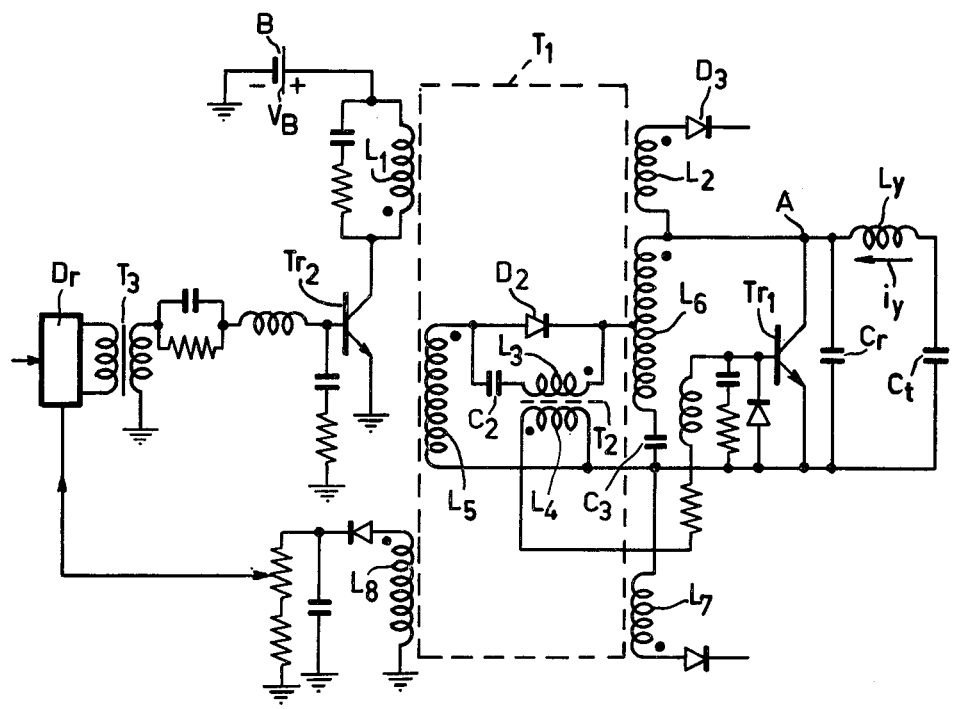

United States Patent [19]

Verbeij

[11] 4,028,589

[45] June 7, 1977

[54] CIRCUIT ARRANGEMENT IN A TELEVISION RECEIVER, PROVIDED WITH A LINE DEFLECTION CIRCUIT AND A SWITCHED SUPPLY VOLTAGE CIRCUIT

[75] Inventor: Oswald Johannes Verbeij, Eindhoven, Netherlands

[73] Assignee: U.S. Philips Corporation, New York, N.Y.

[22] Filed: Jan. 21, 1976

[21] Appl. No.: 651,197

[30] Foreign Application Priority Data

Feb. 5, 1975 Netherlands .................. 7501339

[52] U.S. Cl. .......................... 315/408; 315/399
[51] Int. Cl.[2] .................... H01J 29/70; H01J 29/76
[58] Field of Search ............... 315/407, 408, 399

[56] References Cited

UNITED STATES PATENTS 3,906,307   9/1975   Hattum ........................... 315/408
3,950,674   4/1976   Joosten et al. ................. 315/408

Primary Examiner—Richard A. Farley
Assistant Examiner—T. M. Blum
Attorney, Agent, or Firm—Frank R. Trifari; Henry I. Steckler

[57] ABSTRACT

In a television receiver including a line frequency switched supply voltage circuit and a line deflection circuit in which a first loop is constituted by a winding of the voltage circuit, a winding of the second circuit, a capacitor and a diode. A second loop comprises the control means of the line deflection switch and windings coupled to the above-mentioned windings.

3 Claims, 8 Drawing Figures

1

CIRCUIT ARRANGEMENT IN A TELEVISION RECEIVER, PROVIDED WITH A LINE DEFLECTION CIRCUIT AND A SWITCHED SUPPLY VOLTAGE CIRCUIT

The invention relates to a circuit arrangement in a television receiver which is provided with a line deflection circuit for generating a deflection current of line frequency through a deflection coil, said circuit arrangement including a first switch controllable at line frequency and a first winding and a supply voltage circuit also switched at the line frequency comprising a second switch controllable at line frequency and a second winding, whilst the first switch is controlled by said supply voltage circuit, a first current loop comprising the first winding, a third winding coupled to the second winding, a diode conducting during the cut-off time of the second switch and a capacitor.

Such a circuit arrangement is described in U.S. Pat. application Ser. No. 567,317 filed Apr. 4, 1975, in which the series arrangement of a capacitor and a primary winding of a transformer are arranged in parallel across the diode in order to control the first switch by a square-wave voltage which consequently does not include a retrace pulse. The voltage present across a secondary winding of this transformer is the control voltage of the first switch.

It is an object of the invention to provide a circuit arrangement having the same operation as the arrangement described in said patent application, but in which the said capacitor and transformer, which are expensive components, can be omitted. To this end the circuit arrangement according to the invention is characterized in that the control means of the first switch are incorporated in a second current loop which also comprise a fourth winding coupled to the first winding and a fifth winding coupled to the third winding.

Figure 2:
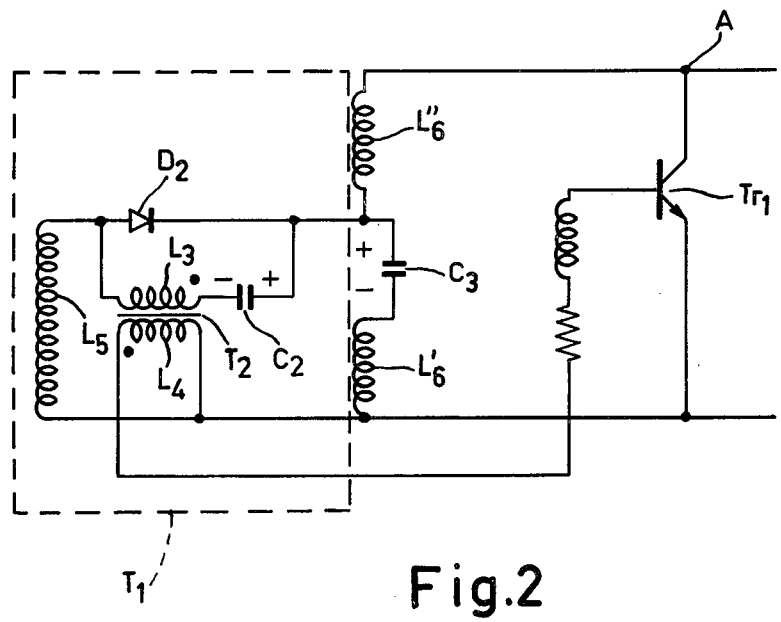
Figure 3A:
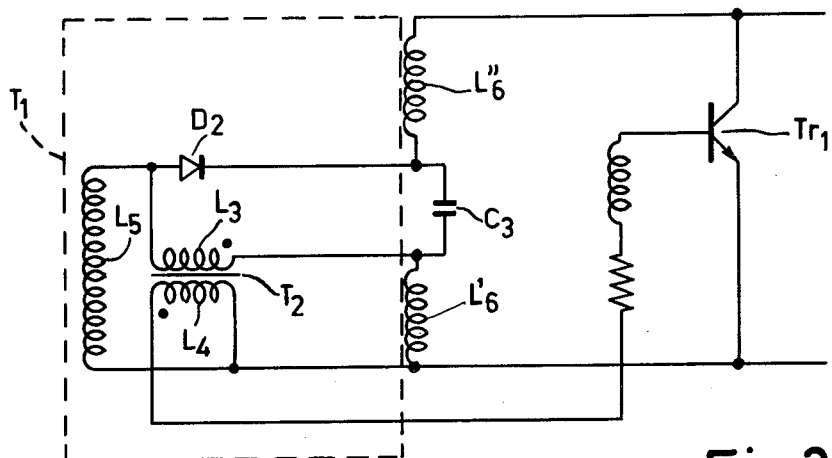
Figure 3B:
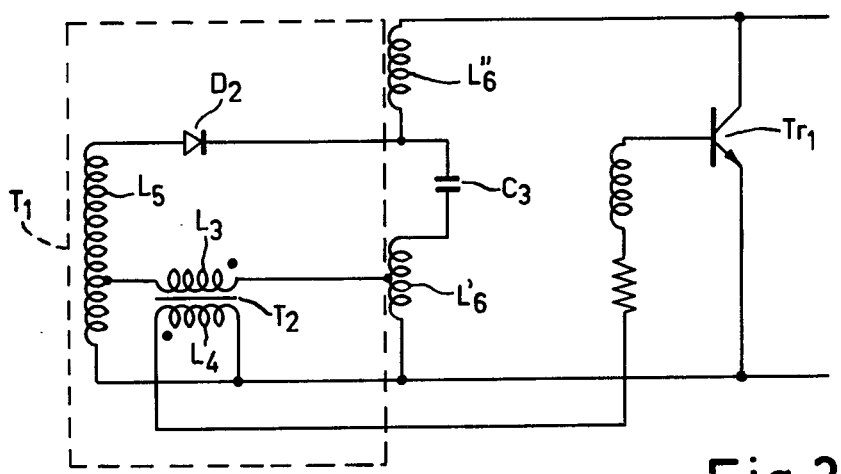
Figure 3C:
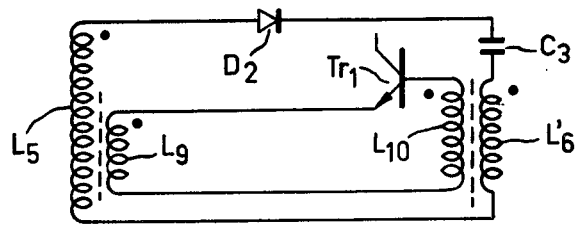
Figure 3D:
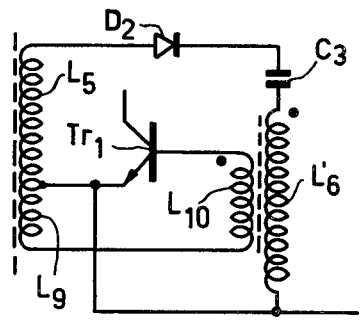
Figure 3E:
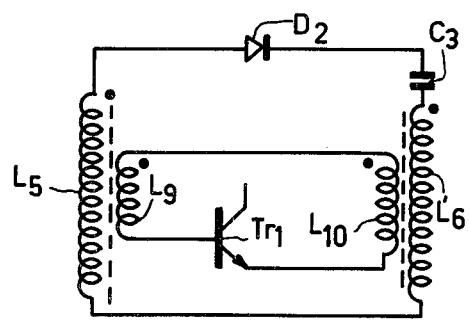
Figure 4:
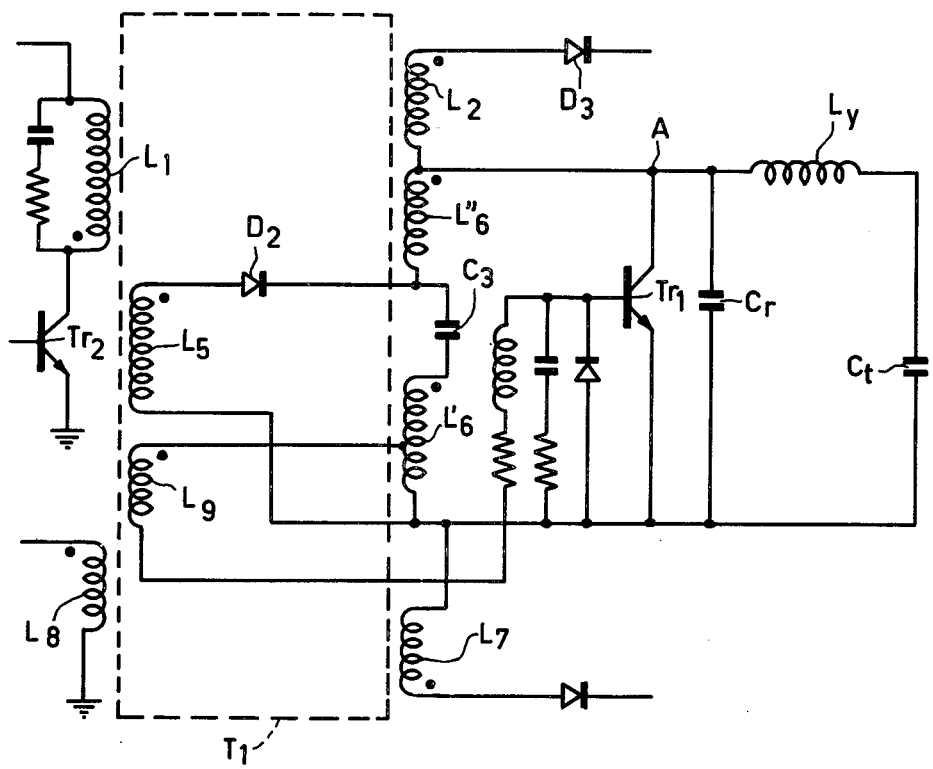

The invention will be described in greater detail by way of example with reference to the accompanying Figures in which FIG. 1 shows the principle circuit diagram of an arrangement described in said patent application, FIG. 2 shows an equivalent circuit diagram of part of the arrangement of FIG. 1, FIGS. 3a to e show embodiments relating to the present invention and FIG. 4 shows an embodiment of the arrangement according to the invention.

The circuit arrangement of FIG. 1 is extensively described in the above-mentioned patent application so that it will suffice to note the following. A switching transistor $Tr_1$, which may be of the Philips type BU 208, a retrace capacitor $C_r$, a line deflection coil $L_y$ and a trace capacitor $C_t$ constitute the main components of the line deflection circuit of a television receiver not further shown. This circuit arrangement may be provided in known manner with one or more transformers for mutual coupling of the elements, arrangements for centring and linearity corrections and the like. It operates in known manner. During a first part of the trace time the collector-base diode of the transistor conducts. The voltage across capacitor $C_t$ is applied to coil $L_y$ through which a sawtooth-shaped deflection current $i_y$ flows. At a certain instant transistor $T_1$ is rendered conducting. Approximately in the middle of the trace time current $i_y$ reverses its direction whereafter current $i_y$ flows through the transistor. At the end of the trace time transistor $Tr_1$ is cut off. An oscillation, the retrace pulse, which reaches a high value in the middle of the retrace time and subsequently decreases again is produced at the junction A of elements $Tr_1$, $C_r$ and $L_y$. When the voltage across capacitor $C_r$ has become zero again, the collector base diode of transistor $Tr_1$ is rendered conducting: this is the commencement of a new trace time.

One end of a primary winding $L_1$ of a transformer $T_1$ is connected to the collector of a second switching transistor $Tr_2$, while the other end thereof is connected to the positive terminal of a direct voltage source B whose negative terminal is connected to the emitter of transistor $Tr_2$.

A driver stage Dr receiving signals from a line oscillator not shown supplies switching pulses for the base of transistor $Tr_2$. During part of the period transistor $Tr_2$ conducts while its collector current flows through winding $L_1$. During the other part of the period transistor $Tr_2$ is cut off.

A winding $L_5$ coupled to winding $L_1$ is connected to the anode of a diode $D_2$ whose cathode is connected to a tap on a winding $L_6$. A capacitor $C_3$ is arranged in series with winding $L_6$. The other end of winding $L_6$ is connected to point A. During the cut-off time of transistor $Tr_2$ diode $D_2$ conducts so that energy derived from source B is supplied to the deflection circuit. Windings $L_1, L_5, L_6$ as well as windings for generating auxiliary supply voltages for other parts of the receiver are provided on the core of transformer $T_1$, which core is shown as a rectangle. Two of these windings, $L_2$ and $L_7$, are shown in FIG. 1. They generate direct voltages with the aid of rectifiers across smoothing capacitances. One of these windings, for example, $L_2$ is the EHT winding, so that the generated voltage is the EHT for the final anode of the television display tube (not shown) The voltage across a further winding $L_8$ of transformer $T_1$ is rectified and an adjustable part of the direct voltage thus obtained is fed back for stabilization purposes to a modulator present in driver stage $D_r$ for influencing the conductor period of transistor $Tr_2$ in such a manner that the DC component $V_o$ of the voltage across capacitor Ct and consequently the amplitude of current $i_y$ remain constant. The winding sense of the different windings is shown by polarity dots in FIG. 1.

In FIG. 1 winding $L_5$ and the elements shown to the right thereof are separated from the electric mains, that is to say, they are separated from ground of the arrangement. Connected thereto are the free ends of elements $L_5$, $L_7$, $C_3$, $C_r$ and $C_t$ as well as the emitter of transistor $Tr_1$. The dead ends of the elements shown to the left of windings $L_5$, are connected to the return lead of the mains.

The series arrangement of a capacitor $C_2$ and a primary winding $L_3$ of a transformer $T_2$ a secondary winding $L_4$ of which controls the base electrode of transistor $Tr_1$ is arranged in parallel across the diode $D_2$. It can be shown that the voltage across winding $L_3$ assumes the value $pV_B - mV_o$ during the time interval when transistor $Tr_2$ is conducting and while diode $D_2$ is blocked wherein $V_B$ is the voltage of source B, while $1:p$ is the ratio between the number of turns $L_1$ and that of winding $L_5$, and $1:m$ is the ratio between the number of turns of the entire winding $L_6$ and that part thereof which is located between the tap and the junction with capacitor $C_3$. The said voltage does not include a retrace pulse during the entire interval provided that transistor $Tr_1$ is controlled in such a manner that the retrace time of deflection current $i_y$ does not occur during this period. During the rest of the line period, when diode $D_2$ conducts, the voltage across winding $L_3$ assumes the value $V_o$. The said voltage, in the same manner as that across winding $L_4$, is square-wave and the base of transistor $Tr_1$ receives a blocking voltage of constant amplitude during the time when diode $D_2$ conducts and a deblocking voltage having a non-stabilized amplitude during the time when the diode does not conduct. The advantages of such a control have been further described in the said patent application, i.e. the fact that the turn-off time of transistor $Tr_1$ substantially does not vary and the fact that the control range of transistor $Tr_2$ is increased.

Elements $C_2$ and $L_3$ of FIG. 1 which are arranged in series may change position. In the same manner capacitor $C_3$ and the part of winding $L_6$ between the tap and the junction with $C_3$ may change position. This is shown in FIG. 2 which is only part of the circuit diagram of FIG. 1 and in which capacitor $C_3$ is incorporated between the said part $L'_6$ of winding $L_6$ and the other part $L''_6$.

Voltages whose mean values are equal to voltage $V_o$ are present across capacitor $C_2$ and $C_3$. In fact, the direct voltage across the different inductors are zero. The voltage at the right-hand end of winding $L_3$ and that at the end of winding $L'_6$ shown at the top are therefore equal, so that the said ends can be connected together with the result that capacitor $C_2$ can be omitted. This is the embodiment of FIG. 3a. If in this embodiment $1:n$ is the ratio between the number of turns of winding $L_3$ and that of winding $L_4$, the embodiment of FIG. 3b is equivalent. The said ratio in this case is equal to 1:1 while the ends of winding $L_3$ are connected to taps on winding $L_5$ and winding $L'_6$, which taps are provided in such a manner that the ratio between the number of turns of windings $L_5$ and $L'_6$ and that of the part thereof shown below the tap is approximately equal to $1:n$. The voltage across winding $L_4$ in FIG. 3b is thus substantially equal to the voltage across the corresponding winding in FIG. 3a.

Since transformer $T_2$ in the modification of FIG. 3b has a transformation ratio of 1:1, it may be omitted, provided that the windings $L_5$ and $L'_6$ formed as autotransformers are replaced by transformers. Thus the simplified circuit diagram of FIG. 3c is obtained in which elements $L_5$, $D_2$, $C_3$ and $L'_6$ constitute a loop while a second loop is constituted by the base-emitter diode of transistor $Tr_1$ and two windings $L_9$ and $L_{10}$. In this case winding $L_9$ is coupled to winding $L_5$ and winding $L_{10}$ is coupled to $L'_6$ and the ratio between the number of turns of $L_5$ and $L'_6$ and that of $L_9$ and $L_{10}$, respectively, is equal to $1:n$.

The emitter of transistor $Tr_1$ and the ends of windings $L_5$ and $L'_6$ shown at the bottom are connected together in the previously described modifications. The embodiment of FIG. 3c L may be replaced in such a case by that of FIG. 3d in which winding $L_9$ is an extension of winding $L_5$. Another embodiment is obtained by incorporating, in FIG. 3c, the base-emitter diode of transistor $Tr_1$ between the ends of windings $L_9$ and $L_{10}$ shown at the bottom and not between their ends shown at the top. This is shown in FIG. 3e. When the emitter of transistor $Tr_1$ and the low side of windings $L_{10}$ and $L'_6$ are connected together, the separation between these windings is not necessary and $L_{10}$ may be replaced by a tap as was the case in FIG. 3b. Thus the embodiment of FIG. 4 is obtained whose operation is identical to that of FIG. 1 and in which transformer $T_2$ and capacitor $C_2$ can be omitted at the expensive of only one extra tap on winding $L_6$ and an extra winding $L_9$.

It will be noted that the voltages across the different windings of transformer $T_1$ do not have the same shape in spite of the fact that the windings are coupled together. This is possible because these shapes are not affected by the coupling because the voltages $V_o$ and $V_B$ which are impressed from the exterior are neither affected. On the other hand the currents flowing through the windings are influenced by the coupling, but this has no detrimental effect on the operation. All this has been further described in U.S. patent application Ser. No. 670,875 filed Mar. 26, 1976. It will be evident that the step according to this patent application is of no importance for the present invention, which means that the windings shown to the left and to the right may constitute two separate transformers. This also applies to the step according to U.S. Pat. No. 3,950,674, which means that the cathode of diode $D_2$ may be directly connected to point A.

What is claimed is:

1. A circuit arrangement for use with a television line deflection coil, said circuit arrangement comprising a first switch controllable at the line frequency and a first winding, coupled to said first switch, a supply voltage circuit means also switched at the line frequency for controlling said first switch comprising a second switch controllable at the line frequency and a second winding coupled to said second switch, a first current loop comprising the first winding, a third winding coupled to the second winding, a diode conducting during the cut-off time of the second switch and a capacitor, and a second current loop which comprises a fourth winding coupled to the first winding and a fifth winding coupled to the third winding.

2. An arrangement as claimed in claim 1, wherein the first switch is driven into conduction during the time interval when the diode is blocked.

3. An arrangement as claimed in claim 1, wherein the first switch is a transistor whose emitter is connected to one end of the first winding and to one end of the third winding, one end of the fifth winding being connected to a tap of the first winding while the other end is coupled to the base of the transistor.

* * * * *